United States Patent
Song et al.

(10) Patent No.: US 10,121,776 B2
(45) Date of Patent: Nov. 6, 2018

(54) FILM-TYPE SEMICONDUCTOR PACKAGES AND DISPLAY DEVICES HAVING THE SAME

(71) Applicant: SAMSUNG ELECTRONICS CO., LTD., Suwon-si, Gyeonggi-Do (KR)

(72) Inventors: Sung-Jun Song, Hwaseong-si (KR); Young-Min Kim, Suwon-si (KR); Chang-Su Kim, Hwaseong-si (KR); Han-Gu Kim, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 37 days.

(21) Appl. No.: 15/364,890

(22) Filed: Nov. 30, 2016

(65) Prior Publication Data

US 2017/0170166 A1 Jun. 15, 2017

(30) Foreign Application Priority Data

Dec. 15, 2015 (KR) ........................ 10-2015-0178879

(51) Int. Cl.
| | |
|---|---|
| H01L 29/78 | (2006.01) |
| H01L 27/02 | (2006.01) |
| H01L 29/866 | (2006.01) |
| H01L 23/535 | (2006.01) |
| H01L 29/786 | (2006.01) |
| H01L 27/12 | (2006.01) |

(52) U.S. Cl.
CPC ........ *H01L 27/0255* (2013.01); *H01L 23/535* (2013.01); *H01L 27/0259* (2013.01); *H01L 27/0292* (2013.01); *H01L 27/1225* (2013.01); *H01L 29/7869* (2013.01); *H01L 29/866* (2013.01)

(58) Field of Classification Search
CPC ....... H01L 29/86; H01L 29/866; H01L 29/78; H01L 29/786; H01L 29/7869; H01L 27/02; H01L 27/025; H01L 27/0259; H01L 27/029; H01L 27/0292; H01L 27/0255; H01L 23/53; H01L 23/535
USPC ............................................... 257/43
See application file for complete search history.

(56) References Cited

U.S. PATENT DOCUMENTS

| | | | |
|---|---|---|---|
| 6,054,975 A | | 4/2000 | Kurokawa et al. |
| 8,906,737 B2* | | 12/2014 | Ishizuka ........... H01L 21/31111 |
| | | | 438/104 |
| 2006/0081968 A1 | | 4/2006 | Bai et al. |
| 2012/0320301 A1 | | 12/2012 | Shin et al. |
| 2013/0240917 A1 | | 9/2013 | Cho et al. |

(Continued)

FOREIGN PATENT DOCUMENTS

| | | |
|---|---|---|
| JP | 3326673 | 7/2002 |
| JP | 2004-094273 | 3/2004 |

(Continued)

*Primary Examiner* — Monica D Harrison
(74) *Attorney, Agent, or Firm* — F. Chau & Associates, LLC

(57) ABSTRACT

A film-type semiconductor package includes a semiconductor integrated circuit and a dummy metal pattern. The semiconductor integrated circuit is formed on a film and includes an electrostatic discharge (ESD) protection circuit. The dummy metal pattern is formed on the film and is electrically connected to the ESD protection circuit through a first wiring formed on the film.

19 Claims, 15 Drawing Sheets

(56) References Cited

U.S. PATENT DOCUMENTS

2014/0285933 A1    9/2014  Kim et al.
2016/0035811 A1*   2/2016  Choi .................. H01L 51/5221
                                                              257/72

FOREIGN PATENT DOCUMENTS

KR         10-0294684      4/2001
KR         1020080020168   3/2008

* cited by examiner

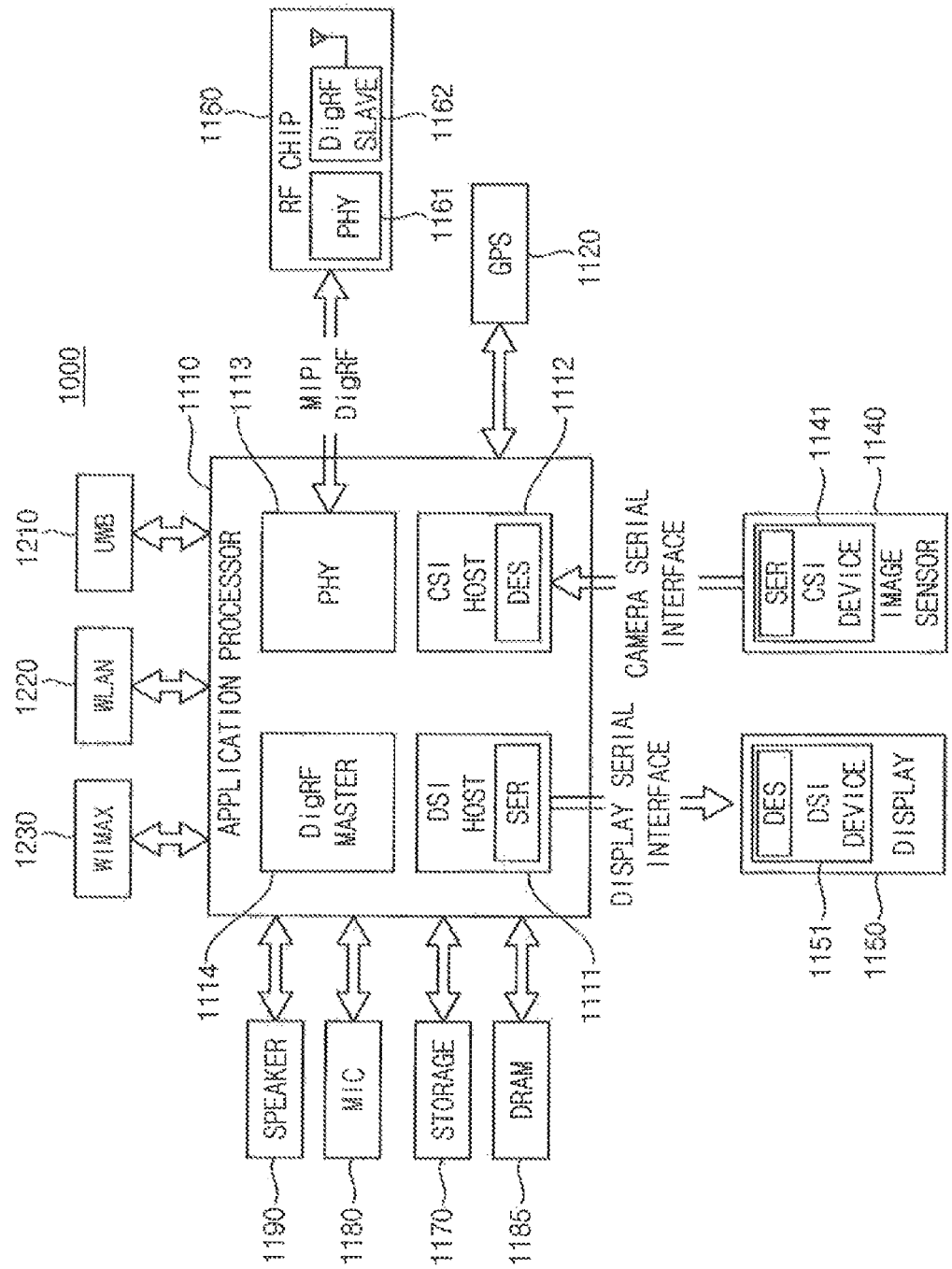

FILM-TYPE SEMICONDUCTOR PACKAGES AND DISPLAY DEVICES HAVING THE SAME

CROSS-REFERENCE TO RELATED APPLICATION

This application claims priority under 35 U.S.C. § 119 to Korean Patent Application No. 10-2015-0178879, filed on Dec. 15, 2015 in the Korean Intellectual Property Office (KIPO), the disclosure of which is incorporated by reference herein in its entirety.

TECHNICAL FIELD

Exemplary embodiments of the inventive concept relate to a film-type semiconductor package, and more particularly, to a film-type semiconductor package having an electrostatic discharge (ESD) protection function and a display device including the film-type semiconductor package.

DISCUSSION OF RELATED ART

As the size of semiconductor devices decreases, a film-type semiconductor package, in which a semiconductor integrated circuit is formed on a film, has been developed. For example, a display driver integrated circuit may be attached or formed on a film to be provided as a film-type package.

However, in a film-type semiconductor package, when an electrostatic discharge (ESD) event occurs in a metallic structure formed on the film, the semiconductor integrated circuit attached on the film may damaged.

SUMMARY

According to an exemplary embodiment of the inventive concept, a film-type semiconductor package includes a semiconductor integrated circuit and a dummy metal pattern. The semiconductor integrated circuit is formed on a film, and includes an electrostatic discharge (ESD) protection circuit. The dummy metal pattern is formed on the film and is electrically connected to the ESD protection circuit through a first wiring formed on the film.

According to an exemplary embodiment of the inventive concept, a film-type display driver integrated circuit package includes a display driver integrated circuit and a dummy metal pattern. The display driver integrated circuit is formed on a film, and includes a first pad, a second pad, a display driver circuit coupled between the first pad and the second pad, and an electrostatic discharge (ESD) protection circuit coupled between the first pad and the second pad. The dummy metal pattern is formed on the film and is electrically connected to at least one of the first pad and the second pad through a first wiring formed on the film.

According to an exemplary embodiment of the inventive concept, a film-type semiconductor package includes a semiconductor integrated circuit and a dummy metal pattern. The semiconductor integrated circuit is formed on a film and includes a first electrostatic discharge (ESD) protection circuit, a first pad, and a second pad. The dummy metal pattern is formed on the film and is electrically connected to the first ESD protection circuit through a first wiring formed on the film. The first ESD protection circuit includes a semiconductor substrate, an n-type well formed in the semiconductor substrate, a p-type well formed in the semiconductor substrate, where the p-type well contacts the n-type well, a first impurity region formed in the n-type well, a second impurity region formed in the n-type well, a third impurity region formed in the p-type well, a fourth impurity region formed in the p-type well, a fifth impurity region formed in the p-type well, a sixth impurity region formed at a boundary region between the n-type well and the p-type well, and a gate. The first impurity region and the fourth impurity region are n-type. The second impurity region, the third impurity region, the fifth impurity region, and the sixth impurity region are p-type. The first impurity region, the second impurity region, and the gate are connected to the first pad. The third impurity region and the fourth impurity region are connected to the second pad.

BRIEF DESCRIPTION OF THE DRAWINGS

The above and other features of the inventive concept will be more clearly understood by describing in detail exemplary embodiments thereof with reference to the accompanying drawings.

FIG. 17 is a block diagram illustrating an example of an interface used in the computing system of FIG. 16.

DETAILED DESCRIPTION OF THE EMBODIMENTS

Figure 1:
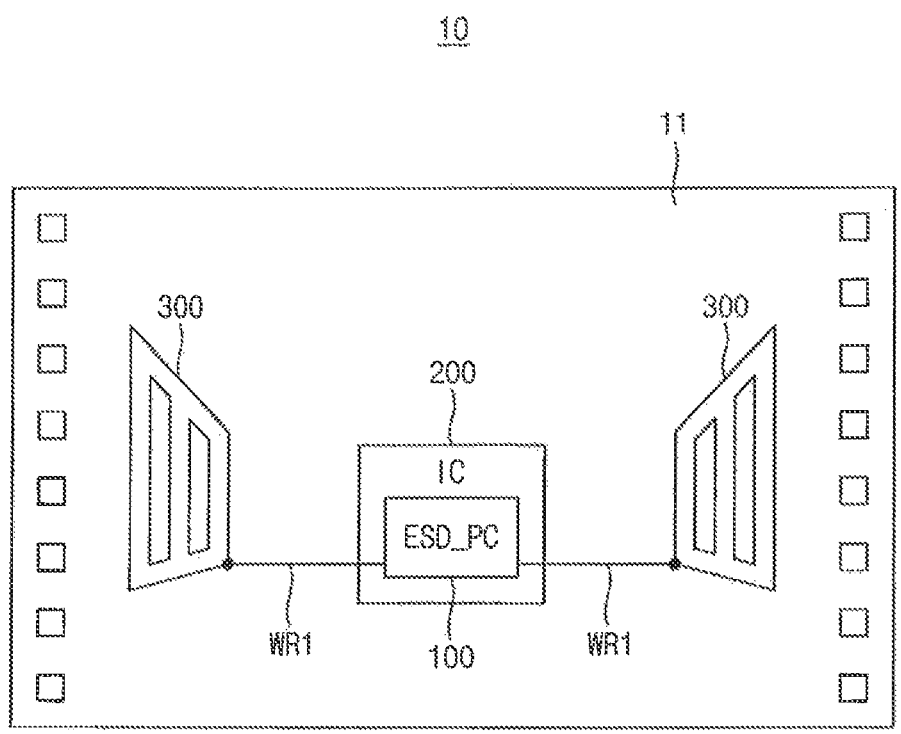
FIG. 1 is a diagram illustrating a film-type semiconductor package according to an exemplary embodiment of the inventive concept.

Exemplary embodiments of the inventive concept will be described more fully hereinafter with reference to the accompanying drawings. Like reference numerals may refer to like elements throughout the accompanying drawings.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept.

It will be understood that when an element is referred to as being "connected" or "coupled" to another element, it can be directly connected or coupled to the other element or intervening elements may be present.

As used herein, the singular forms "a," "an", and "the" are intended to include the plural forms as well, unless the context clearly indicates otherwise.

Exemplary embodiments of the inventive concept are directed to a film-type semiconductor package that protects a semiconductor integrated circuit formed on a film from an electrostatic discharge (ESD) event that occurs in a metallic structure formed on the film.

Exemplary embodiments of the inventive concept are directed to a film-type display driver integrated circuit package that protects a display driver integrated circuit (DDI) formed on a film from an ESD event that occurs in a metallic structure formed on the film.

Exemplary embodiments of the inventive concept are directed to a display device including the film-type display driver integrated circuit package.

FIG. 1 is a diagram illustrating a film-type semiconductor package according to an exemplary embodiment of the inventive concept.

Referring to FIG. 1, a film-type semiconductor package 10 includes a semiconductor integrated circuit 200 and a dummy metal pattern 300 formed on a film 11.

According to exemplary embodiments of the inventive concept, the film 11 may correspond to a polyimide film. However, exemplary embodiments are not limited thereto. For example, the film 11 may be any kind of film.

As will be described later with reference to FIG. 2, the semiconductor integrated circuit 200 may be coupled to an external device through a wiring pattern formed on the film 11, such that the semiconductor integrated circuit 200 may communicate with the external device through the wiring pattern.

The semiconductor integrated circuit 200 may include a functional block and an electrostatic discharge (ESD) protection circuit (ESD_PC) 100.

The functional block may perform a predetermined function. For example, the functional block may include a display driver circuit for driving a display panel. In this case, the semiconductor integrated circuit 200 may correspond to a display driver integrated circuit (DDI). However, exemplary embodiments are not limited thereto. According to an exemplary embodiment of the inventive concept, the semiconductor integrated circuit 200 may be any kind of integrated circuit.

The ESD protection circuit 100 may protect the functional block from an ESD event. For example, when the ESD event occurs in the semiconductor integrated circuit 200 such that a plurality of charges flow into the semiconductor integrated circuit 200, the ESD protection circuit 100 may safely discharge the plurality of charges to a ground voltage to protect the functional block. A detailed description about a structure of the ESD protection circuit 100 will be described later with reference to FIGS. 10 to 13.

In exemplary embodiments, the dummy metal pattern 300 is not used in a normal operation of the semiconductor integrated circuit 200. In other words, in exemplary embodiments, the dummy metal pattern 300 may perform a function different from the normal operation of the semiconductor integrated circuit 200.

According to exemplary embodiments of the inventive concept, the dummy metal pattern 300 may be used to increase the strength of the film 11. The film 11 may be bendable. If the film 11 is bent sharply, a crack may occur in the wiring pattern formed on the film 11 such that the semiconductor integrated circuit 200 may not operate correctly. Since the film-type semiconductor package 10, according to exemplary embodiments, includes the dummy metal pattern 300 formed on the film 11, the dummy metal pattern 300 may prevent the film-type semiconductor package 10 from being bent sharply and causing cracks in the wiring pattern. Therefore, errors in the film-type semiconductor package 10 may be prevented or reduced, such that operation reliability of the film-type semiconductor package 10 may be increased.

According to exemplary embodiments of the inventive concept, the dummy metal pattern 300 may be used to emit heat generated by the semiconductor integrated circuit 200. In this case, the dummy metal pattern 300 may include a material having high heat conductivity. When the semiconductor integrated circuit 200 operates for a long time, heat generated by the semiconductor integrated circuit 200 may cause an increase in temperature. If the temperature of the semiconductor integrated circuit 200 is high, the semiconductor integrated circuit 200 may not operate correctly. The film-type semiconductor package 10, according to exemplary embodiments, may effectively emit heat generated by the semiconductor integrated circuit 200 through the dummy metal pattern 300 formed on the film 11. Therefore, malfunction of the film-type semiconductor package 10 caused by high temperature may be prevented or reduced, such that operation reliability of the film-type semiconductor package 10 may be increased.

According to exemplary embodiments of the inventive concept, the dummy metal pattern 300 may be used to define a location at which the semiconductor integrated circuit 200 is formed on the film 11 during a manufacturing process of the film-type semiconductor package 10. For example, during the manufacturing process of the film-type semiconductor package 10, the location at which the semiconductor integrated circuit 200 is formed on the film 11 may be defined by the dummy metal pattern 300, and then the semiconductor integrated circuit 200 may be attached at the location defined by the dummy metal pattern 300. As such, the dummy metal pattern 300 may be used to arrange the semiconductor integrated circuit 200 at a desired location on the film 11.

As illustrated in FIG. 1, the dummy metal pattern 300 may be electrically connected to the ESD protection circuit 100 through a first wiring WR1 formed on the film 11.

Although FIG. 1 illustrates an exemplary embodiment of the inventive concept where the film-type semiconductor package 10 includes two dummy metal patterns 300 formed on the film 11, exemplary embodiments are not limited thereto. For example, the film-type semiconductor package 10 may include any number of the dummy metal patterns 300 formed on the film 11.

In addition, the shape of the dummy metal pattern 300 as illustrated in FIG. 1 is only an example. According to exemplary embodiments of the inventive concept, the dummy metal pattern 300 may have any shape.

Since the dummy metal pattern 300 is exposed to the outside, an ESD event may occur in the dummy metal pattern 300.

If the dummy metal pattern 300 is in a floating state, such that it is not coupled to the ESD protection circuit 100 included in the semiconductor integrated circuit 200, when an ESD event occurs in the dummy metal pattern 300, a plurality of charges may be transmitted to the semiconductor integrated circuit 200 from the dummy metal pattern 300 through the film 11. In this case, the semiconductor integrated circuit 200 may not operate correctly or may be damaged.

If a separate ESD protection device is formed on the film 11 to protect the film-type semiconductor package 10 from ESD events occurring in the dummy metal pattern 300, manufacturing cost may increase.

However, as described above, in the film-type semiconductor package 10 according to exemplary embodiments of the inventive concept, the dummy metal pattern 300 may be electrically connected to the ESD protection circuit 100 included in the semiconductor integrated circuit 200 through the first wiring WR1 formed on the film 11. Therefore, if an ESD event occurs in the dummy metal pattern 300, a plurality of charges transferred to the dummy metal pattern 300 may be safely discharged to a ground voltage through the ESD protection circuit 100. As such, ESD protection of the film-type semiconductor package 10 may be increased without increasing manufacturing cost.

Figure 2:
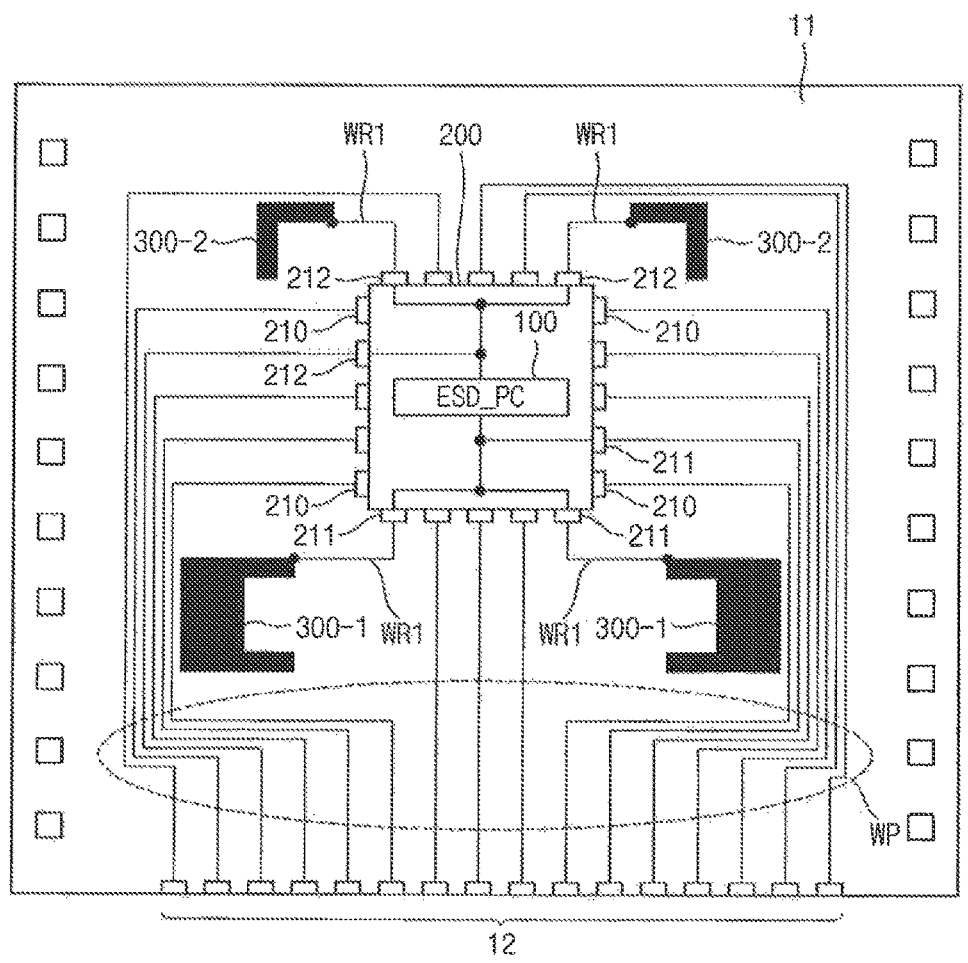
FIG. 2 is a diagram illustrating an example of the film-type semiconductor package of FIG. 1.

FIG. 2 is a diagram illustrating an example of the film-type semiconductor package of FIG. 1.

Referring to FIG. 2, a film-type semiconductor package 10a may include a semiconductor integrated circuit 200 and dummy metal patterns 300-1 and 300-2 formed on a film 11. The semiconductor integrated circuit 200 may include an ESD protection circuit 100.

The semiconductor integrated circuit 200 may include a plurality of pads 210. In addition, a plurality of external pads 12 may be formed at a boundary of the film 11. The plurality of external pads 12 may be coupled to an external device.

The plurality of pads 210 may be coupled to the plurality of external pads 12 through a wiring pattern WP formed on the film 11. Therefore, the semiconductor integrated circuit 200 may communicate with the external device through the wiring pattern WP.

Although FIG. 1 illustrates that the plurality of external pads 12 are formed at one boundary of the film 11, exemplary embodiments are not limited thereto. According to exemplary embodiments of the inventive concept, the plurality of external pads 12 may be formed at a plurality of boundaries of the film 11.

The ESD protection circuit 100 may be coupled between a first pad 211 and a second pad 212 among the plurality of pads 210. In this case, a functional block included in the semiconductor integrated circuit 200 may also be coupled between the first pad 211 and the second pad 212.

According to exemplary embodiments of the inventive concept, as illustrated in FIG. 2, there may be at least two first pads 211 that are electrically connected to one another internally in the semiconductor integrated circuit 200, and there may be at least two second pads 212 that are electrically connected to one another internally in the semiconductor integrated circuit 200. Although the semiconductor integrated circuit 200 illustrated in FIG. 2 includes at least two first pads 211 and two second pads 212, the inventive concept is not limited thereto. For example, according to exemplary embodiments of the inventive concept, the semiconductor integrated circuit 200 may include one first pad 211 and one second pad 212.

The dummy metal pattern 300-1 may be electrically connected to the first pad 211 through the first wiring WR1 formed on the film 11. The dummy metal pattern 300-2 may be electrically connected to the second pad 212 through the first wiring WR1 formed on the film 11. The dummy metal patterns 300-1 and 300-2 may be electrically connected to the ESD protection circuit 100 included in the semiconductor integrated circuit 200 through the first wiring WR1.

In FIG. 2, the dummy metal pattern 300-1 may define a location at which the semiconductor integrated circuit 200 is formed on the film 11 during a manufacturing process of the film-type semiconductor package 10. Therefore, the dummy metal pattern 300-1 may be used to arrange the semiconductor integrated circuit 200 at a desired location on the film 11. On the other hand, the dummy metal pattern 300-2 may be used to increase the strength of the film 11 and/or emit heat generated by the semiconductor integrated circuit 200.

According to exemplary embodiments of the inventive concept, the dummy metal patterns 300-1 and 300-2 may each be coupled to a nearest pad among the at least one first pad 211 and the at least one second pad 212 through the first wiring WR1.

According to exemplary embodiments of the inventive concept, the first pad 211 may correspond to a power supply pad to which a supply voltage is provided, and the second pad 212 may correspond to a ground pad to which a ground voltage is provided. In this case, the dummy metal patterns 300-1 and 300-2 may be electrically connected to the power supply pad and the ground pad, respectively, through the first wiring WR1.

According to exemplary embodiments of the inventive concept, the first pad 211 may correspond to a data input/output pad through which data is transmitted, and the second pad 212 may correspond to a ground pad to which a ground voltage is provided. In this case, the dummy metal patterns 300-1 and 300-2 may be electrically connected to the data input/output pad and the ground pad, respectively, through the first wiring WR1.

As described above, the ESD protection circuit 100 may be coupled to both the functional block included in the semiconductor integrated circuit 200 and the dummy metal patterns 300-1 and 300-2 formed on the film 11. Therefore, when an ESD event occurs in the semiconductor integrated circuit 200 such that a plurality of charges flow into the semiconductor integrated circuit 200 or when an ESD event occurs in the dummy metal patterns 300-1 or 300-2 such that a plurality of charges flows into the dummy metal patterns 300-1 or 300-2, the ESD protection circuit 100 may safely discharge the plurality of charges to the ground voltage.

FIGS. 3 to 9 are diagrams illustrating examples of the film-type semiconductor package of FIG. 1.

With respect to the exemplary embodiments shown in FIGS. 3 to 9, the film-type semiconductor packages may include a film 11, a wiring pattern WP, a plurality of pads 210, and a plurality of external pads 12 as described with reference to FIGS. 1 and 2. For ease of explanation, the film 11, the wiring pattern WP, and the plurality of external pads 12 are omitted, and only the semiconductor integrated circuit 200 and the dummy metal pattern 300 are illustrated in FIGS. 3 to 9.

Figure 3:
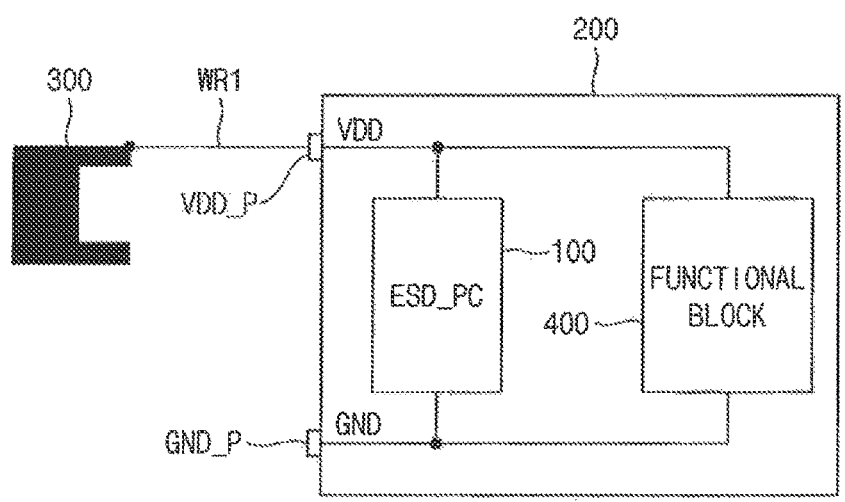
FIGS. 3 to 9 are diagrams illustrating examples of the film-type semiconductor package of FIG. 1.

Referring to FIG. 3, a film-type semiconductor package 10b may include a semiconductor integrated circuit 200 and a dummy metal pattern 300 formed on a film 11.

The semiconductor integrated circuit 200 may include a functional block 400 and an ESD protection circuit 100.

The functional block 400 may be coupled between a power supply pad VDD_P, to which a supply voltage VDD is provided, and a ground pad GND_P, to which a ground voltage GND is provided, among the plurality of pads 210 included in the semiconductor integrated circuit 200. The functional block 400 may operate using the supply voltage VDD.

For example, the functional block 400 may receive the supply voltage VDD from an external device through the wiring pattern WP coupled to the power supply pad VDD_P, and receive the ground voltage GND from the external device through the wiring pattern WP coupled to the ground pad GND_P.

The ESD protection circuit 100 may be coupled between the power supply pad VDD_P and the ground pad GND_P.

The ESD protection circuit 100 may be turned off while the functional block 400 performs a normal operation. When an ESD event occurs at the power supply pad VDD_P such that a plurality of charges flows into the semiconductor integrated circuit 200 through the power supply pad VDD_P, the ESD protection circuit 100 may be turned on to discharge the plurality of charges to the ground voltage GND through the ground pad GND_P.

As illustrated in FIG. 3, the dummy metal pattern 300 may be coupled to the power supply pad VDD_P of the semiconductor integrated circuit 200 through the first wiring WR1 formed on the film 11.

As described above with reference to FIG. 2, according to exemplary embodiments, the semiconductor integrated circuit 200 may include one power supply pad VDD_P, or at least two power supply pads VDD_P which are electrically connected to one another internally in the semiconductor integrated circuit 200. Therefore, the dummy metal pattern 300 may be coupled to a nearest power supply pad VDD_P through the first wiring WR1 among the at least two power supply pads VDD_P.

As described above, since the dummy metal pattern 300 is coupled to the ESD protection circuit 100 through the first wiring WR1, when an ESD event occurs in the dummy metal pattern 300, a plurality of charges flowing into the dummy metal pattern 300 may be safely discharged to the ground voltage GND through the first wiring WR1, the power supply pad VDD_P, the ESD protection circuit 100, and the ground pad GND_P.

Figure 4:
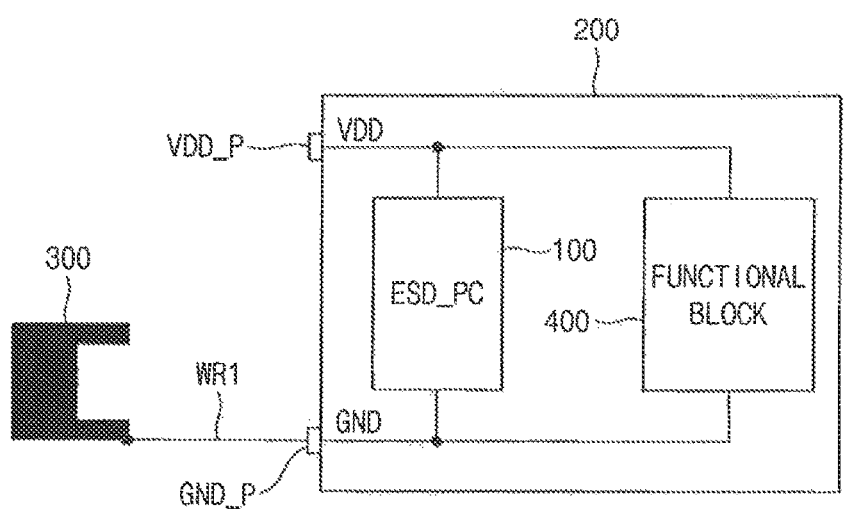

Referring to FIG. 4, a film-type semiconductor package 10c may include a semiconductor integrated circuit 200 and a dummy metal pattern 300 formed on a film 11.

The semiconductor integrated circuit 200 included in the film-type semiconductor package 10c of FIG. 4 is substantially the same as the semiconductor integrated circuit 200 included in the film-type semiconductor package 10b of FIG. 3. Therefore, detailed description about the semiconductor integrated circuit 200 of FIG. 4 will be omitted.

As illustrated in FIG. 4, the dummy metal pattern 300 may be coupled to the ground pad GND_P of the semiconductor integrated circuit 200 through the first wiring WR1 formed on the film 11.

As described above with reference to FIG. 2, according to exemplary embodiments, the semiconductor integrated circuit 200 may include one ground pad GND_P, or at least two ground pads GND_P which are electrically connected to one another internally in the semiconductor integrated circuit 200. Therefore, the dummy metal pattern 300 may be coupled to a nearest ground pad GND_P through the first wiring WR1 among the at least two ground pads GND_P.

In this case, when an ESD event occurs in the dummy metal pattern 300, a plurality of charges flowing into the dummy metal pattern 300 may be safely discharged to the ground voltage GND through the first wiring WR1 and the ground pad GND_P.

Figure 5:
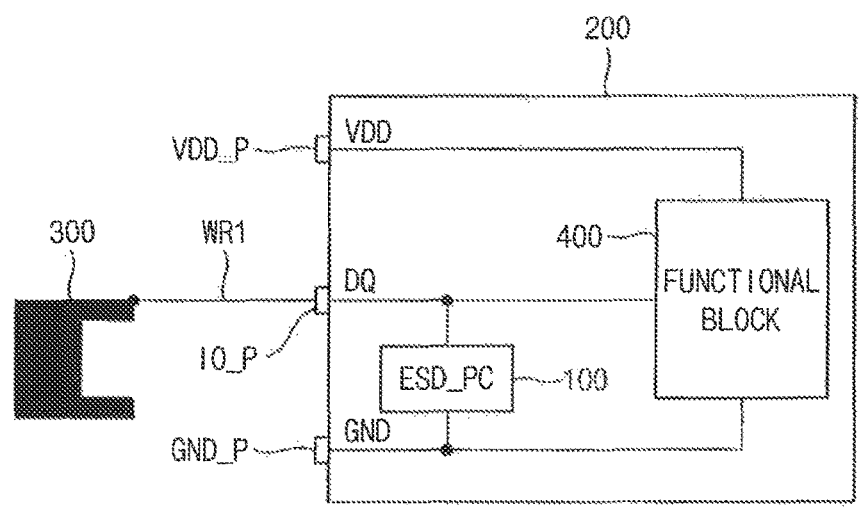

Referring to FIG. 5, a film-type semiconductor package 10d may include a semiconductor integrated circuit 200 and a dummy metal pattern 300 formed on a film 11.

The semiconductor integrated circuit 200 may include a functional block 400 and an ESD protection circuit 100.

The functional block 400 may be coupled to a power supply pad VDD_P (to which a supply voltage VDD is provided), a ground pad GND_P (to which a ground voltage GND is provided), and a data input/output pad IO_P (through which data DQ is transmitted), among the plurality of pads 210 included in the semiconductor integrated circuit 200. The functional block 400 may transmit the data DQ through the data input/output pad IO_P using the supply voltage VDD.

For example, the functional block 400 may receive the supply voltage VDD from the external device through the wiring pattern WP coupled to the power supply pad VDD_P, receive the ground voltage GND from the external device through the wiring pattern WP coupled to the ground pad GND_P, and communicate the data DQ with the external device through the wiring pattern WP coupled to the data input/output pad IO_P.

The ESD protection circuit 100 may be coupled between the data input/output pad IO_P and the ground pad GND_P.

The ESD protection circuit 100 may be turned off while the functional block 400 performs a normal operation. When an ESD event occurs at the data input/output pad IO_P such that a plurality of charges flows into the semiconductor integrated circuit 200 through the data input/output pad IO_P, the ESD protection circuit 100 may be turned on to discharge the plurality of charges to the ground voltage GND through the ground pad GND_P.

As illustrated in FIG. 5, the dummy metal pattern 300 may be coupled to the data input/output pad IO_P through the first wiring WR1 formed on the film 11.

As described above with reference to FIG. 2, according to exemplary embodiments, the semiconductor integrated circuit 200 may include one data input/output pad IO_P, or at least two data input/output pads IO_P which are electrically connected to one another internally in the semiconductor integrated circuit 200. Therefore, the dummy metal pattern 300 may be coupled to a nearest data input/output pad IO_P through the first wiring WR1 among the at least two data input/output pads IO_P.

As described above, since the dummy metal pattern 300 is coupled to the ESD protection circuit 100 through the first wiring WR1, when an ESD event occurs in the dummy metal pattern 300, a plurality of charges flowing into the dummy metal pattern 300 may be safely discharged to the ground voltage GND through the first wiring WR1, the data input/output pad IO_P, the ESD protection circuit 100, and the ground pad GND_P.

Figure 6:
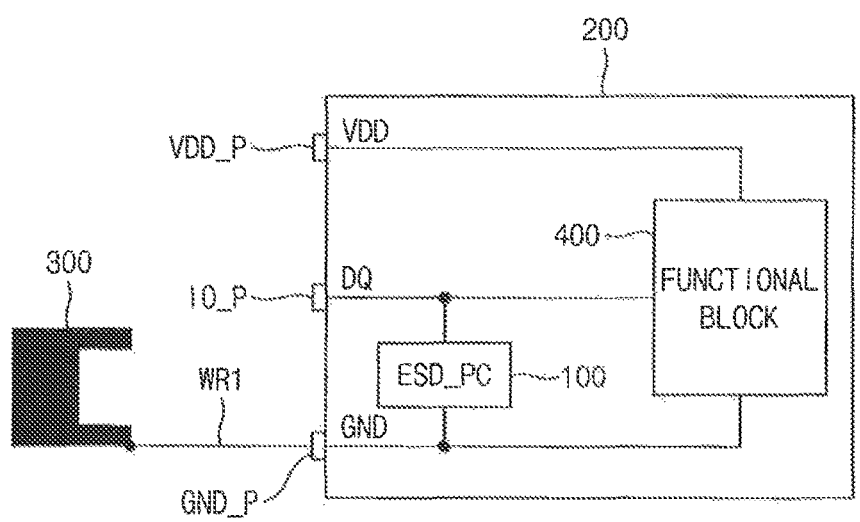

Referring to FIG. 6, a film-type semiconductor package 10e may include a semiconductor integrated circuit 200 and a dummy metal pattern 300 formed on a film 11.

The semiconductor integrated circuit 200 included in the film-type semiconductor package 10e of FIG. 6 is substantially the same as the semiconductor integrated circuit 200 included in the film-type semiconductor package 10d of FIG. 5. Therefore, detailed description about the semiconductor integrated circuit 200 of FIG. 6 will be omitted.

As illustrated in FIG. 6, the dummy metal pattern 300 may be coupled to the ground pad GND_P of the semiconductor integrated circuit 200 through the first wiring WR1 formed on the film 11.

As described above with reference to FIG. 2, according to exemplary embodiments, the semiconductor integrated circuit 200 may include one ground pad GND_P, or at least two ground pads GND_P which are electrically connected to one another internally in the semiconductor integrated circuit 200. Therefore, the dummy metal pattern 300 may be coupled to a nearest ground pad GND_P through the first wiring WR1 among the at least two ground pads GND_P.

In this case, when an ESD event occurs in the dummy metal pattern 300, a plurality of charges flowing into the dummy metal pattern 300 may be safely discharged to the ground voltage GND through the first wiring WR1 and the ground pad GND_P.

Figure 7:
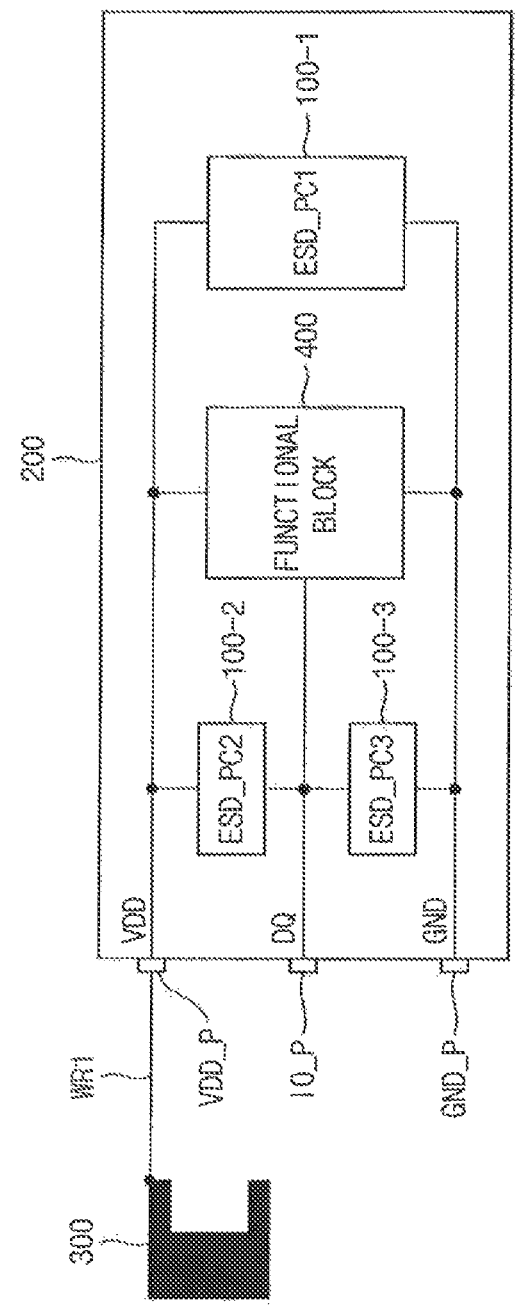

Referring to FIG. 7, a film-type semiconductor package 10*f* may include a semiconductor integrated circuit 200 and a dummy metal pattern 300 formed on a film 11.

The semiconductor integrated circuit 200 may include a functional block 400, a first ESD protection circuit (ESD_PC1) 100-1, a second ESD protection circuit (ESD_PC2) 100-2, and a third ESD protection circuit (ESD_PC3) 100-3.

The functional block 400 may be coupled to a power supply pad VDD_P (to which a supply voltage VDD is provided), a ground pad GND_P (to which a ground voltage GND is provided), and a data input/output pad IO_P (through which data DQ is transmitted), among the plurality of pads 210 included in the semiconductor integrated circuit 200. The functional block 400 may transmit the data DQ through the data input/output pad IO_P using the supply voltage VDD.

For example, the functional block 400 may receive the supply voltage VDD from the external device through the wiring pattern WP coupled to the power supply pad VDD_P, receive the ground voltage GND from the external device through the wiring pattern WP coupled to the ground pad GND_P, and communicate the data DQ with the external device through the wiring pattern WP coupled to the data input/output pad IO_P.

The first ESD protection circuit 100-1 may be coupled between the power supply pad VDD_P and the ground pad GND_P. The second ESD protection circuit 100-2 may be coupled between the power supply pad VDD_P and the data input/output pad IO_P. The third ESD protection circuit 100-3 may be coupled between the data input/output pad IO_P and the ground pad GND_P.

The first ESD protection circuit 100-1, the second ESD protection circuit 100-2, and the third ESD protection circuit 100-3 may be turned off while the functional block 400 performs a normal operation.

When an ESD event occurs at the power supply pad VDD_P such that a plurality of charges flows into the semiconductor integrated circuit 200 through the power supply pad VDD_P, the first ESD protection circuit 100-1, the second ESD protection circuit 100-2, and the third ESD protection circuit 100-3 may be turned on. In this case, a part of the plurality of charges flowing into the semiconductor integrated circuit 200 may be safely discharged to the ground voltage GND through the first ESD protection circuit 100-1 and the ground pad GND_P, and the rest of the plurality of charges may be safely discharged to the ground voltage GND through the second ESD protection circuit 100-2, the third ESD protection circuit 100-3, and the ground pad GND_P.

When an ESD event occurs at the data input/output pad IO_P such that a plurality of charges flows into the semiconductor integrated circuit 200 through the data input/output pad IO_P, the first ESD protection circuit 100-1, the second ESD protection circuit 100-2, and the third ESD protection circuit 100-3 may be turned on. In this case, a part of the plurality of charges flowing into the semiconductor integrated circuit 200 may be safely discharged to the ground voltage GND through the third ESD protection circuit 100-3 and the ground pad GND_P, and the rest of the plurality of charges may be safely discharged to the ground voltage GND through the second ESD protection circuit 100-2, the first ESD protection circuit 100-1, and the ground pad GND_P.

As illustrated in FIG. 7, the dummy metal pattern 300 may be coupled to the power supply pad VDD_P through the first wiring WR1 formed on the film 11.

As described above with reference to FIG. 2, according to exemplary embodiments, the semiconductor integrated circuit 200 may include one power supply pad VDD_P, or at least two power supply pads VDD_P which are electrically connected to one another internally in the semiconductor integrated circuit 200. Therefore, the dummy metal pattern 300 may be coupled to a nearest power supply pad VDD_P through the first wiring WR1 among the at least two power supply pads VDD_P.

As described above, since the dummy metal pattern 300 is coupled to the first ESD protection circuit 100-1, the second ESD protection circuit 100-2, and the third ESD protection circuit 100-3 through the first wiring WR1, when an ESD event occurs in the dummy metal pattern 300, a part of a plurality of charges, flowing into the semiconductor integrated circuit 200 from the dummy metal pattern 300 through the first wiring WR1 and the power supply pad VDD_P, may be safely discharged to the ground voltage GND through the first ESD protection circuit 100-1 and the ground pad GND_P. The rest of the plurality of charges may be safely discharged to the ground voltage GND through the second ESD protection circuit 100-2, the third ESD protection circuit 100-3, and the ground pad GND_P.

Figure 8:
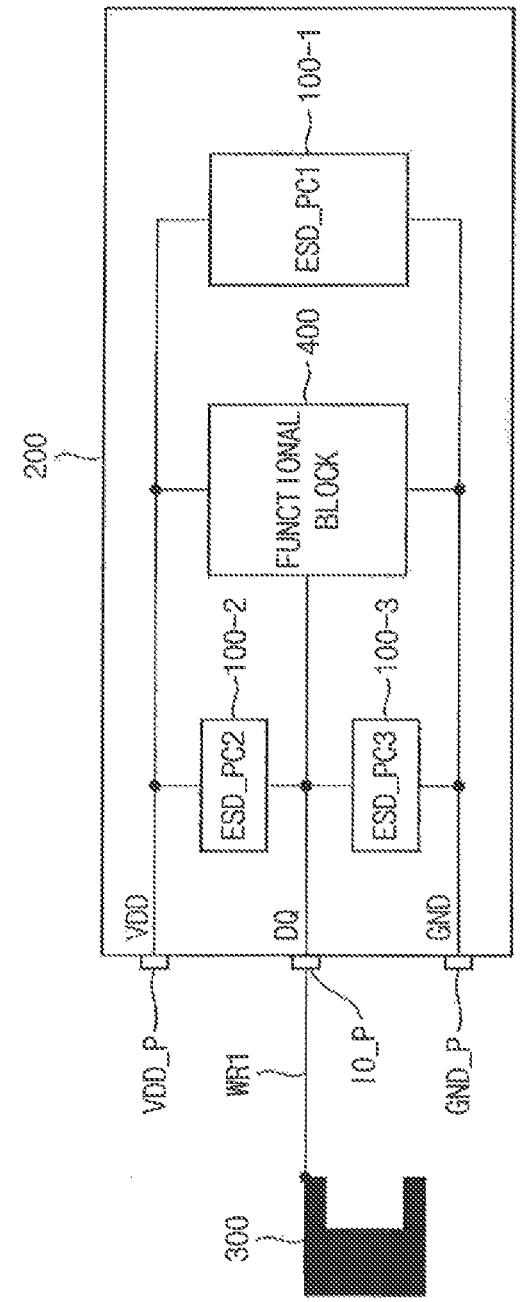

Referring to FIG. 8, a film-type semiconductor package 10*g* may include a semiconductor integrated circuit 200 and a dummy metal pattern 300 formed on a film 11.

The semiconductor integrated circuit 200 included in the film-type semiconductor package 10*g* of FIG. 8 is substantially the same as the semiconductor integrated circuit 200 included in the film-type semiconductor package 10*f* of FIG. 7. Therefore, a detailed description about the semiconductor integrated circuit 200 of FIG. 8 will be omitted.

As illustrated in FIG. 8, the dummy metal pattern 300 may be coupled to the data input/output pad IO_P of the semiconductor integrated circuit 200 through the first wiring WR1 formed on the film 11.

As described above with reference to FIG. 2, according to exemplary embodiments, the semiconductor integrated circuit 200 may include one data input/output pad IO_P, or at least two data input/output pads IO_P which are electrically connected to one another internally in the semiconductor integrated circuit 200. Therefore, the dummy metal pattern 300 may be coupled to a nearest data input/output pad IO_P through the first wiring WR1 among the at least two data input/output pads IO_P.

As described above, since the dummy metal pattern 300 is coupled to the first ESD protection circuit 100-1, the second ESD protection circuit 100-2, and the third ESD protection circuit 100-3 through the first wiring WR1, when an ESD event occurs in the dummy metal pattern 300, a part of a plurality of charges, flowing into the semiconductor integrated circuit 200 from the dummy metal pattern 300 through the first wiring WR1 and the data input/output pad IO_P, may be safely discharged to the ground voltage GND through the third ESD protection circuit 100-3 and the ground pad GND_P. The rest of the plurality of charges may be safely discharged to the ground voltage GND through the second ESD protection circuit 100-2, the first ESD protection circuit 100-1, and the ground pad GND_P.

Figure 9:
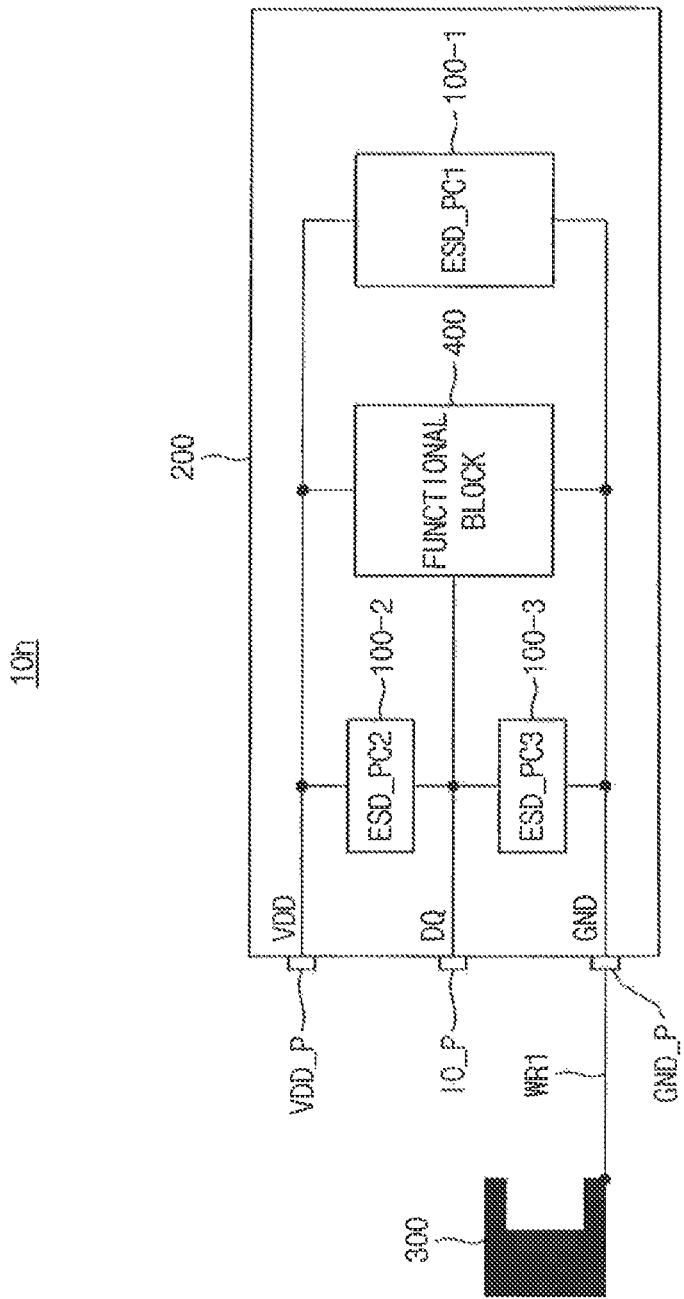

Referring to FIG. 9, a film-type semiconductor package 10h may include a semiconductor integrated circuit 200 and a dummy metal pattern 300 formed on a film 11.

The semiconductor integrated circuit 200 included in the film-type semiconductor package 10h of FIG. 9 is substantially the same as the semiconductor integrated circuit 200 included in the film-type semiconductor package 10f of FIG. 7. Therefore, a detailed description about the semiconductor integrated circuit 200 of FIG. 9 will be omitted.

As illustrated in FIG. 9, the dummy metal pattern 300 may be coupled to the ground pad GND_P of the semiconductor integrated circuit 200 through the first wiring WR1 formed on the film 11.

As described above with reference to FIG. 2, according to exemplary embodiments, the semiconductor integrated circuit 200 may include one ground pad GND_P, or at least two ground pads GND_P which are electrically connected to one another internally in the semiconductor integrated circuit 200. Therefore, the dummy metal pattern 300 may be coupled to a nearest ground pad GND_P through the first wiring WR1 among the at least two ground pads GND_P.

In this case, when an ESD event occurs in the dummy metal pattern 300, a plurality of charges flowing into the dummy metal pattern 300 may be safely discharged to the ground voltage GND through the first wiring WR1 and the ground pad GND_P.

Figure 10:
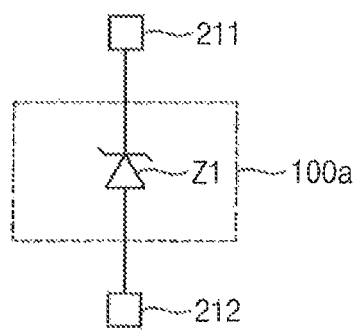
FIG. 10 is a circuit diagram illustrating an example of an electrostatic discharge (ESD) protection circuit included in the film-type semiconductor package of FIG. 1.

FIG. 10 is a circuit diagram illustrating an example of an electrostatic discharge (ESD) protection circuit included in the film-type semiconductor package of FIG. 1.

The ESD protection circuit 100 and the first through third ESD protection circuits 100-1, 100-2, and 100-3 described above with reference to FIGS. 1 to 9 may be implemented with an ESD protection circuit 100a of FIG. 10.

Referring to FIG. 10, the ESD protection circuit 100a may include a Zener diode Z1, which is coupled between the first pad 211 and the second pad 212 among the plurality of pads 210 included in the semiconductor integrated circuit 200.

According to exemplary embodiments of the inventive concept, the first pad 211, which is coupled to a cathode of the Zener diode Z1, may correspond to one of the power supply pad VDD_P (to which the supply voltage VDD is provided from the external device) and the data input/output pad IO_P (through which the data DQ is communicated with the external device). The second pad 212, which is coupled to an anode of the Zener diode Z1, may correspond to the ground pad GND_P, to which the ground voltage GND is provided from the external device.

Since a voltage of the first pad 211 corresponding to the cathode of the Zener diode Z1 is higher than a voltage of the second pad 212 corresponding to the anode of the Zener diode Z1, while the functional block 400 performs a normal operation, the ESD protection circuit 100a may be turned off.

However, when an ESD event occurs at the first pad 211 such that a plurality of charges flows into the ESD protection circuit 100a through the first pad 211, the ESD protection circuit 100a may be turned on to discharge the plurality of charges to the ground voltage GND through the second pad 212.

Figure 11:
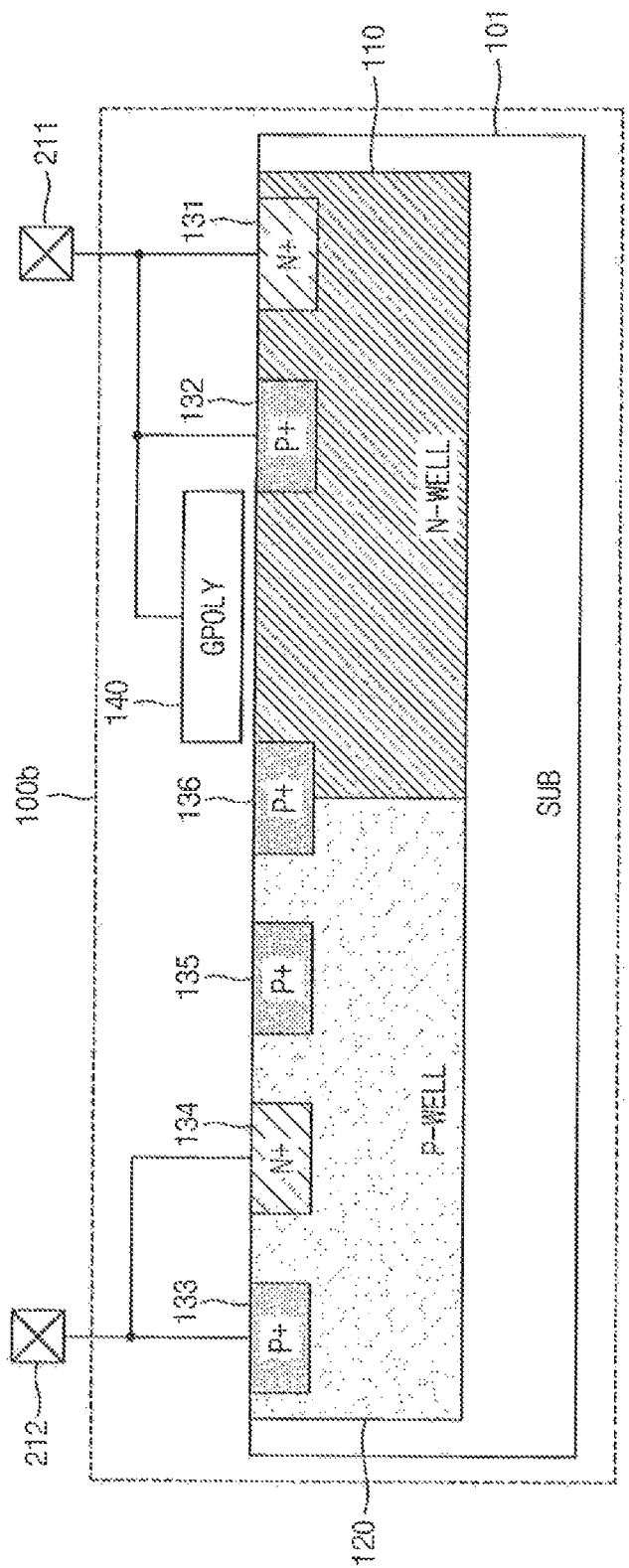
FIG. 11 is a circuit diagram illustrating an example of the ESD protection circuit included in the film-type semiconductor package of FIG. 1.

FIG. 11 is a circuit diagram illustrating an example of the ESD protection circuit included in the film-type semiconductor package of FIG. 1.

The ESD protection circuit 100 and the first through third ESD protection circuits 100-1, 100-2, and 100-3 described above with reference to FIGS. 1 to 9 may be implemented with an ESD protection circuit 100b of FIG. 11.

Referring to FIG. 11, the ESD protection circuit 100b may include a semiconductor substrate SUB 101, a first well 110, a second well 120, a first impurity region N+ 131, a second impurity region P+ 132, a third impurity region P+ 133, a fourth impurity region N+ 134, a fifth impurity region P+ 135, a sixth impurity region P+ 136, and a gate (GPOLY) 140.

The first well 110 may be formed in the semiconductor substrate 101. The first well 110 may have a first conductive type.

The second well 120 may be formed in the semiconductor substrate 101 and contact the first well 110. The second well 120 may have a second conductive type.

According to exemplary embodiments of the inventive concept, the first conductive type may correspond to n-type, and the second conductive type may correspond to p-type. In this case, the first well 110 may correspond to an n-well, and the second well 120 may correspond to a p-well.

Hereinafter, the first conductive type is assumed to be n-type, and the second conductive type is assumed to be p-type.

The first impurity region N+ 131 may be formed in the first well 110. The first impurity region N+ 131 may be of n-type. According to exemplary embodiments of the inventive concept, an impurity concentration of the first impurity region N+ 131 may be higher than an impurity concentration of the first well 110.

The second impurity region P+ 132 may be formed in the first well 110. The second impurity region P+ 132 may be spaced apart from the first impurity region N+ 131 in a direction of the second well 120. The second impurity region P+ 132 may be of p-type. According to exemplary embodiments of the inventive concept, an impurity concentration of the second impurity region P+ 132 may be higher than an impurity concentration of the second well 120.

The third impurity region P+ 133 may be formed in the second well 120. The third impurity region P+ 133 may be of p-type. According to exemplary embodiments of the inventive concept, an impurity concentration of the third impurity region P+ 133 may be higher than the impurity concentration of the second well 120.

The fourth impurity region N+ 134 may be formed in the second well 120. The fourth impurity region N+ 134 may be spaced apart from the third impurity region P+ 133 in a direction of the first well 110. The fourth impurity region N+ 134 may be of n-type. According to exemplary embodiments of the inventive concept, an impurity concentration of the fourth impurity region N+ 134 may be higher than the impurity concentration of the first well 110.

The fifth impurity region P+ 135 may be formed in the second well 120. The fifth impurity region P+ 135 may be spaced apart from the fourth impurity region N+ 134 in a direction of the first well 110. The fifth impurity region P+ 135 may be of p-type. According to exemplary embodiments of the inventive concept, an impurity concentration of the fifth impurity region P+ 135 may be higher than the impurity concentration of the second well 120.

The sixth impurity region P+ 136 may be formed at a boundary region between the first well 110 and the second well 120. The sixth impurity region P+ 136 may be spaced apart from and disposed between the second impurity region P+ 132 and the fifth impurity region P+ 135. The sixth impurity region P+ 136 may be of p-type. According to exemplary embodiments of the inventive concept, an impurity concentration of the sixth impurity region P+ 136 may be higher than the impurity concentration of the second well 120.

According to exemplary embodiments of the inventive concept, the first impurity region N+ 131 and the fourth impurity region N+ 134 may be formed at substantially the same time by the same ion implantation process. Therefore, the impurity concentrations of the first impurity region N+ 131 and the fourth impurity region N+ 134 may be substantially the same.

According to exemplary embodiments of the inventive concept, the second impurity region P+ 132, the third impurity region P+ 133, the fifth impurity region P+ 135, and the sixth impurity region P+ 136 may be formed at substantially the same time by the same ion implantation process. Therefore, the impurity concentrations of the second impurity region P+ 132, the third impurity region P+ 133, the fifth impurity region P+ 135, and the sixth impurity region P+ 136 may be substantially the same.

The gate 140 may be formed above the semiconductor substrate 101 between the second impurity region P+ 132 and the sixth impurity region P+ 136. According to exemplary embodiments of the inventive concept, the gate 140 may include polysilicon.

The first impurity region N+ 131, the second impurity region P+ 132, and the gate 140 may be electrically connected to the first pad 211 among the plurality of pads 210 included in the semiconductor integrated circuit 200. The third impurity region P+ 133 and the fourth impurity region N+ 134 may be electrically connected to the second pad 212 among the plurality of pads 210 included in the semiconductor integrated circuit 200.

The fifth impurity region P+ 135 and the sixth impurity region P+ 136 may be electrically floated.

According to exemplary embodiments of the inventive concept, the first pad 211 may correspond to one of the power supply pad VDD_P (to which the supply voltage VDD is provided from the external device) and the data input/output pad IO_P (through which the data DQ is communicated with the external device). The second pad 212 may correspond to the ground pad GND_P, to which the ground voltage GND is provided from the external device.

When an ESD event occurs such that a plurality of positive charges flows into the ESD protection device 100b through the first pad 211, the ESD protection circuit 100b may be turned on to discharge the plurality of positive charges to the second pad 212.

Figure 12:
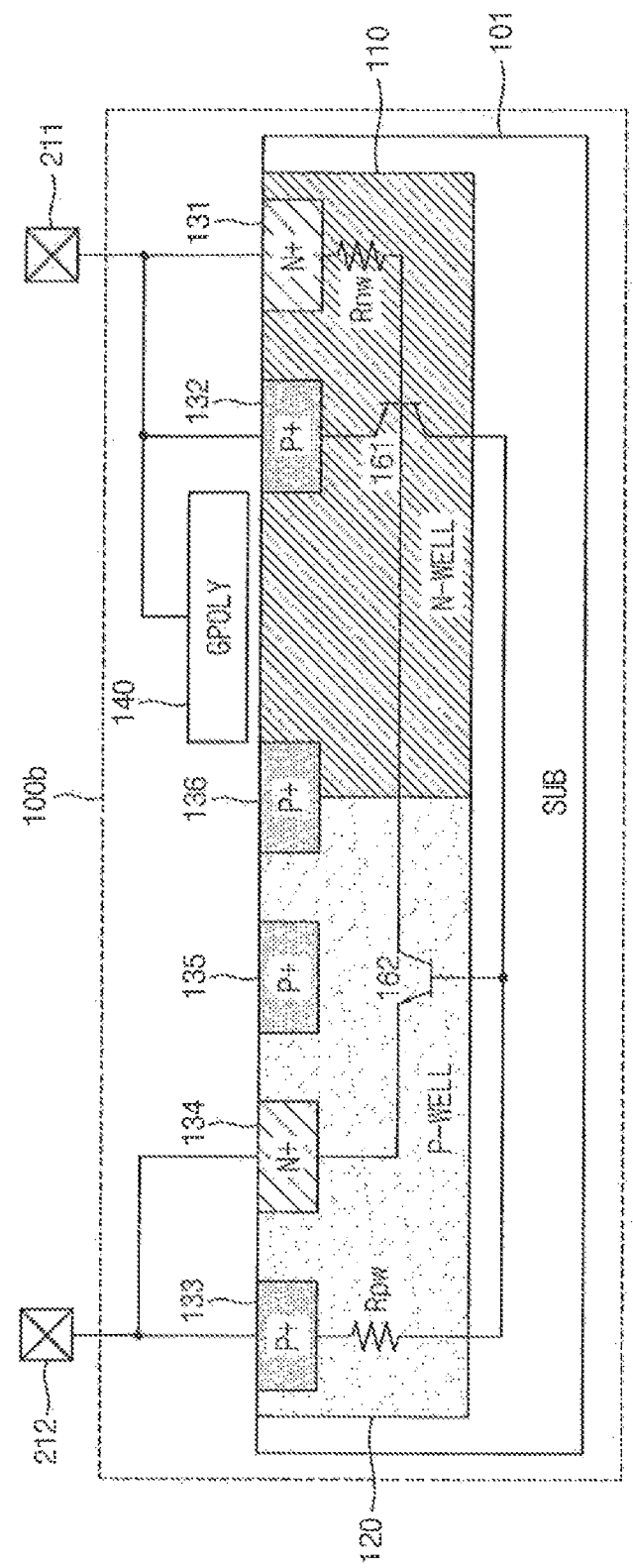
FIG. 12 is a diagram illustrating a bipolar junction transistor (BJT) parasitically formed in the ESD protection circuit of FIG. 11 according to an exemplary embodiment of the inventive concept.
Figure 13:
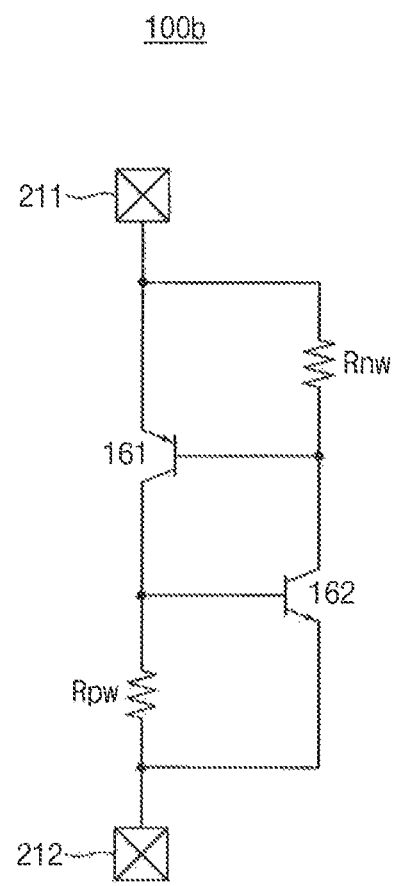
FIG. 13 is a circuit diagram illustrating an equivalent circuit of the ESD protection circuit of FIG. 11 according to an exemplary embodiment of the inventive concept.

FIG. 12 is a diagram illustrating a bipolar junction transistor (BJT) parasitically formed in the ESD protection circuit of FIG. 11 according to an exemplary embodiment of the inventive concept. FIG. 13 is a circuit diagram illustrating an equivalent circuit of the ESD protection circuit of FIG. 11 according to an exemplary embodiment of the inventive concept.

Referring to FIG. 12, a PNP bipolar junction transistor (BJT) 161 may be parasitically formed in the ESD protection circuit 100b. An emitter of the PNP BJT 161 may correspond to the second impurity region P+ 132, a base of the PNP BJT 161 may correspond to the first well 110, and a collector of the PNP BJT 161 may correspond to the second well 120 and the third impurity region P+ 133.

In addition, an NPN BJT 162 may be parasitically formed in the ESD protection circuit 100b. A collector of the NPN BJT 162 may correspond to the first impurity region N+ 131 and the first well 110, a base of the NPN BJT 162 may correspond to the second well 120, and an emitter of the NPN BJT 162 may correspond to the fourth impurity region N+ 134.

In FIG. 12, a resistance of the first well 110 is represented as an n-well resistor Rnw, and a resistance of the second well 120 is represented as a p-well resistor Rpw.

Therefore, an equivalent circuit of the ESD protection circuit 100b of FIG. 11 may be represented as the circuit diagram of FIG. 13.

Hereinafter, an operation of the ESD protection circuit 100b will be described with reference to FIGS. 11 to 13.

When an ESD event occurs, a plurality of positive charges may flow into the ESD protection circuit 100b through the first pad 211. Since the positive charges are transferred to the first well 110, electric potential of the first well 110 may increase as the amount of the positive charges flowing into the ESD protection circuit 100b increases. Therefore, the first well 110 and the second well 120 may be in a reverse biased state. When the electric potential of the first well 110 increases such that the electric potential difference between the first well 110 and the second well 120 reaches a breakdown voltage, an avalanche breakdown may occur at a junction of the first well 110 and the second well 120.

When the avalanche breakdown occurs, electron-hole pairs may be generated and holes of the electron-hole pairs may be transferred to the second well 120 to increase electric potential of the second well 120. When the electric potential of the second well 120 increases such that the electric potential difference between the second well 120 and the fourth impurity region N+ 134 becomes greater than a threshold voltage of the NPN BJT 162, the NPN BJT 162 may be turned on.

When the NPN BJT 162 is turned on, a current may flow from the first pad 211 to the second pad 212 through the first impurity region N+ 131, the first well 110, the second well 120, and the fourth impurity region N+ 134. While the current flows through the first well 110, a voltage drop may occur at the first well 110 because of the n-well resistor Rnw. Therefore, the electric potential of the first well 110 may become lower than the electrical potential of the second impurity region P+ 132, such that the PNP BJT 161 may be turned on.

When the PNP BJT 161 is turned on, a current may flow from the first pad 211 to the second pad 212 through the second impurity region P+ 132, the first well 110, the second well 120, and the third impurity region P+ 133. While the current flows through the second well 120, a voltage drop may occur at the second well 120 because of the p-well resistor Rpw. Therefore, the electric potential of the second well 120 may be maintained higher than the electrical potential of the fourth impurity region N+ 134, such that the NPN BJT 162 may be turned on more strongly.

As described above, when an ESD event occurs such that a plurality of positive charges flows into the ESD protection circuit 100b through the first pad 211, the PNP BJT 161 and the NPN BJT 162 may be maintained in a turned on state through positive feedback. Therefore, when the ESD event occurs, the ESD protection circuit 100b may be turned on to discharge the positive charges to the second pad 212.

A conventional silicon controlled rectifier (SCR) does not include the fifth impurity region P+ 135, the sixth impurity region P+ 136, and the gate 140. Therefore, a triggering voltage of the conventional SCR is relatively high and a holding voltage of the conventional SCR is relatively low.

On the other hand, the ESD protection circuit 100b, according to exemplary embodiments of the inventive concept, may include the sixth impurity region P+ 136, which is formed at a boundary region between the first well 110 and the second well 120. Since the impurity concentration of the sixth impurity region P+ 136 is higher than the impurity concentration of the second well 120, the breakdown voltage, at which an avalanche breakdown occurs at a junction of the first well 110 and the second well 120, may decrease because of the sixth impurity region P+ 136. As such, a triggering voltage of the ESD protection circuit 100*b* may decrease.

In addition, the ESD protection circuit 100*b*, according to exemplary embodiments of the inventive concept, may include the gate 140, which is formed above the semiconductor substrate 101 between the second impurity region P+ 132 and the sixth impurity region P+ 136, and is electrically connected to the first pad 211. Since the second impurity region P+ 132, the sixth impurity region P+ 136, and the gate 140 form a metal oxide semiconductor (MOS) transistor, the breakdown voltage, at which an avalanche breakdown occurs at a junction of the first well 110 and the second well 120, may be similar to a breakdown voltage of the MOS transistor. As such, the triggering voltage of the ESD protection circuit 100*b* may further decrease.

Moreover, the ESD protection circuit 100*b*, according to exemplary embodiments of the inventive concept, may include the fifth impurity region P+ 135, which is formed in the second well 120 and spaced apart from the fourth impurity region N+ 134 in a direction of the first well 110. Therefore, a distance between the first well 110 and the fifth impurity region P+ 135 may be smaller than a distance between the first well 110 and the third impurity region P+ 133. As such, when the PNP BJT 161 is turned on, a portion of the current, which flows from the first pad 211 to the second pad 212 through the second impurity region P+ 132, the first well 110, the second well 120, and the third impurity region P+ 133, may be leaked to the fifth impurity region P+ 135, such that a current gain of the PNP BJT 161 may decrease. Since a holding voltage of the ESD protection circuit 100*b* is inversely proportional to the current gain of the PNP BJT 161, the holding voltage of the ESD protection circuit 100*b* may increase.

As described above with reference to FIGS. 11 to 13, since the ESD protection circuit 100*b* has a relatively low triggering voltage and a relatively high holding voltage, ESD protection of the film-type semiconductor package 10 may be increased when the semiconductor integrated circuit 200 includes the ESD protection circuit 100*b* of FIG. 11.

Hereinabove, examples of the ESD protection circuit 100 included in the semiconductor integrated circuit 200 are described with reference to FIGS. 10 to 13. However, exemplary embodiments are not limited thereto. For example, the ESD protection circuit 100 included in the semiconductor integrated circuit 200 may be implemented with various structures.

Figure 14:
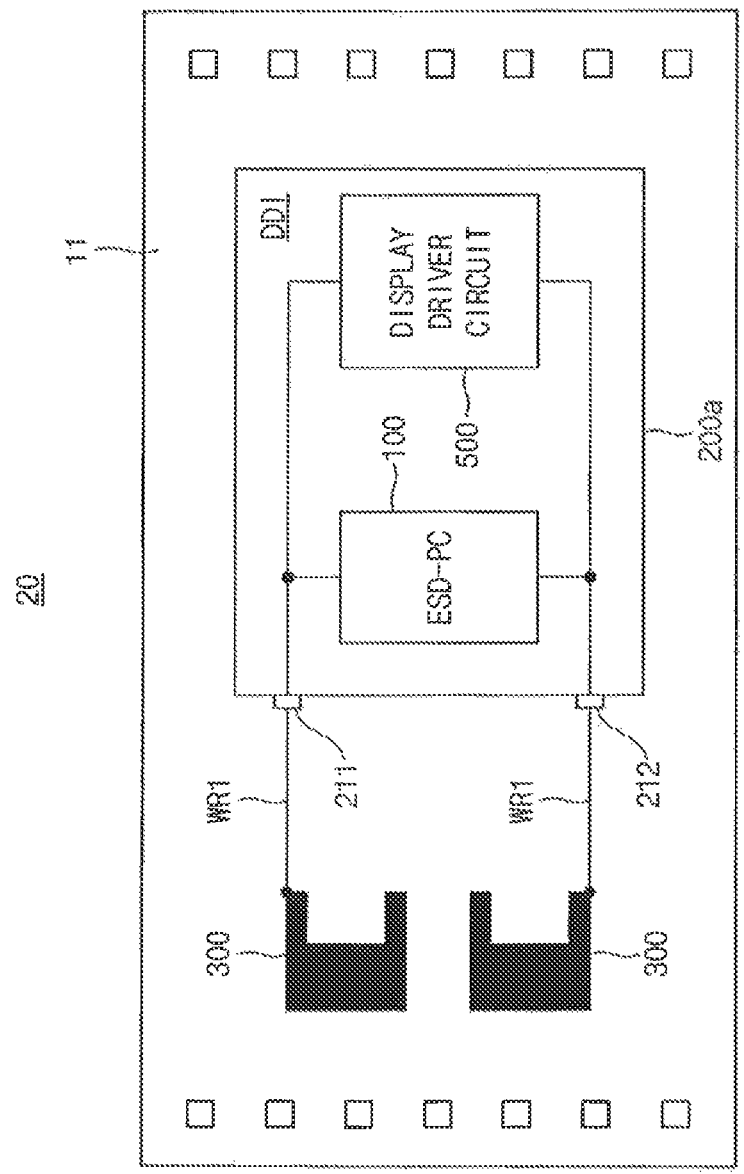
FIG. 14 is a diagram illustrating a film-type display driver integrated circuit package according to an exemplary embodiment of the inventive concept.

FIG. 14 is a diagram illustrating a film-type display driver integrated circuit package according to an exemplary embodiment of the inventive concept.

Referring to FIG. 14, a film-type display driver integrated circuit package 20 includes a display driver integrated circuit DDI 200*a* and a dummy metal pattern 300 formed on a film 11.

The display driver integrated circuit 200*a* may include a display driver circuit 500 coupled between a first pad 211 and a second pad 212, and an ESD protection circuit 100 coupled between the first pad 211 and the second pad 212.

As illustrated in FIG. 14, the dummy metal pattern 300 may be electrically connected to at least one of the first pad 211 and the second pad 212 through a first wiring WR1 formed on the film 11. Therefore, the dummy metal pattern 300 may be electrically connected to the ESD protection circuit 100 through the first wiring WR1.

According to exemplary embodiments of the inventive concept, the first pad 211 may correspond to a power supply pad to which a supply voltage is provided, and the second pad 212 may correspond to a ground pad to which a ground voltage is provided. In this case, the dummy metal pattern 300 may be electrically connected to at least one of the power supply pad and the ground pad, to which the ESD protection circuit 100 is coupled, through the first wiring WR1.

According to exemplary embodiments of the inventive concept, the first pad 211 may correspond to a data input/output pad through which data is transmitted, and the second pad 212 may correspond to a ground pad to which a ground voltage is provided. In this case, the dummy metal pattern 300 may be electrically connected to at least one of the data input/output pad and the ground pad, to which the ESD protection circuit 100 is coupled, through the first wiring WR1.

The film-type display driver integrated circuit package 20 of FIG. 14 may correspond to the film-type semiconductor package 10 of FIG. 1 where the semiconductor integrated circuit 200 of FIG. 1 is implemented as the display driver integrated circuit 200*a* of FIG. 14. In other words, when the functional block 400 included in the semiconductor integrated circuit 200 of FIG. 1 is implemented as the display driver circuit 500, the film-type semiconductor package 10 of FIG. 1 may be substantially the same as the film-type display driver integrated circuit package 20 of FIG. 14.

Since the structure of the semiconductor integrated circuit 200 and connections between the semiconductor integrated circuit 200 and the dummy metal pattern 300 are described above with reference to FIGS. 1 to 13, a detailed description about the film-type display driver integrated circuit package 20 will be omitted.

Figure 15:
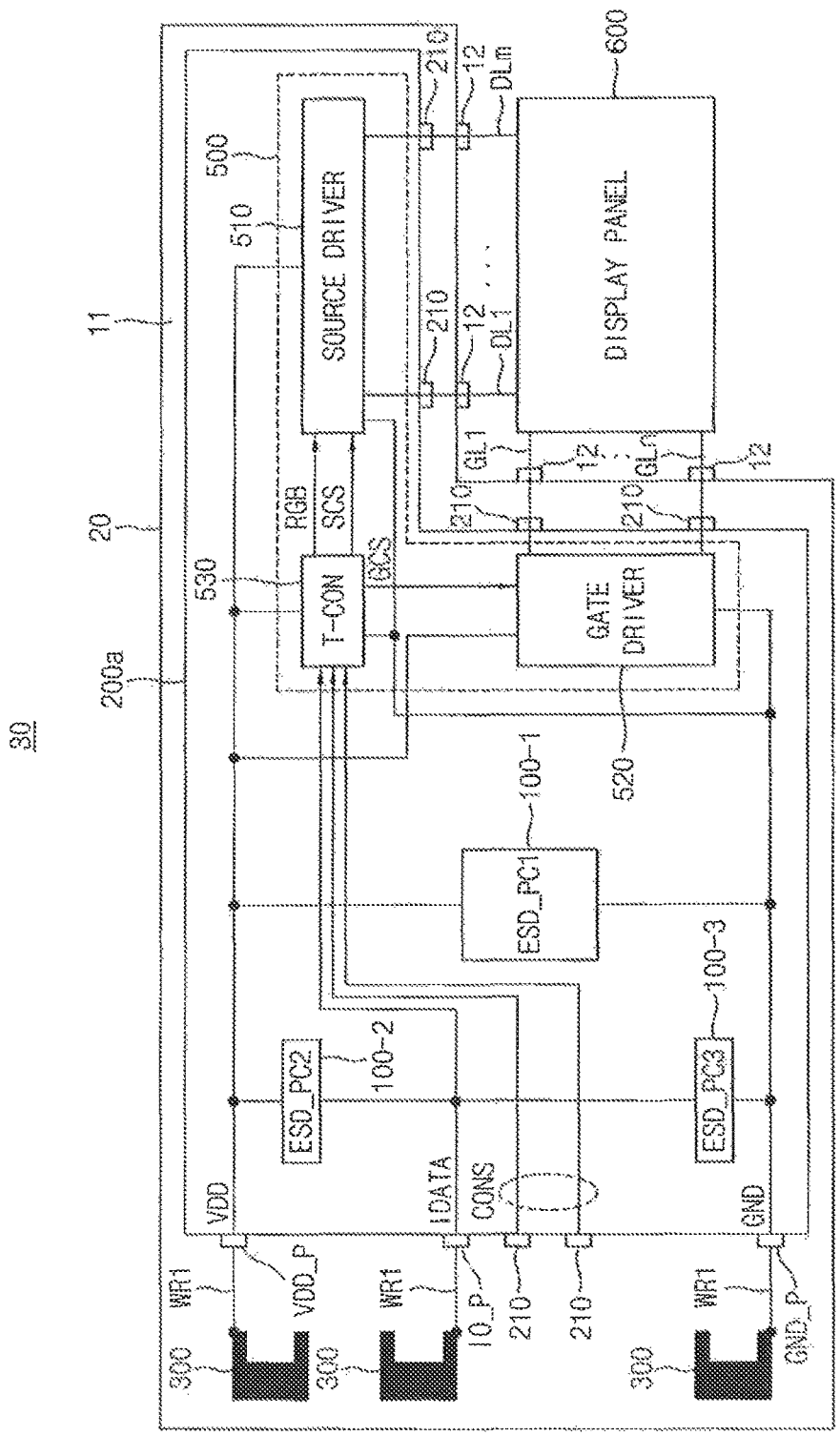
FIG. 15 is a block diagram illustrating a display device according to an exemplary embodiment of the inventive concept.

FIG. 15 is a block diagram illustrating a display device according to an exemplary embodiment of the inventive concept.

Referring to FIG. 15, a display device 30 includes a film-type display driver integrated circuit package 20 and a display panel 600.

The film-type display driver integrated circuit package 20 included in the display device 30 of FIG. 15 may correspond to the film-type display driver integrated circuit package 20 of FIG. 14.

For ease of explanation, a wiring pattern WP formed on the film 11 of the film-type display driver integrated circuit package 20 is omitted in FIG. 15.

The display panel 600 may include red pixels, green pixels, and blue pixels coupled to a plurality of gate lines GL1~GLn and a plurality of data lines DL1~DLm. Here, n and m represent positive integers.

The film-type display driver integrated circuit package 20 may be coupled to the plurality of gate lines GL1~GLn and the plurality of data lines DL1~DLm through a plurality of external pads 12 formed at a boundary of the film 11.

The film-type display driver integrated circuit package 20 may include a display driver integrated circuit 200*a* and a dummy metal pattern 300 formed on the film 11.

The display driver integrated circuit 200*a* may include a display driver circuit 500, a first ESD protection circuit (ESD_PC1) 100-1, a second ESD protection circuit (ESD_PC2) 100-2, and a third ESD protection circuit (ESD_PC3) 100-3.

The display driver integrated circuit 200*a* may be coupled to the display panel 600 and an external host through a plurality of pads 210. The display driver integrated circuit 200*a* may receive a supply voltage VDD from the external host through a power supply pad VDD_P among the plurality of pads 210, receive a ground voltage GND from the external host through a ground pad GND_P among the plurality of pads 210, receive input data IDATA from the external host through a data input/output pad IO_P among the plurality of pads 210, and receive command signals CONS from the external host through a part of the plurality of pads 210.

The display driver circuit 500 may include a source driver 510, a gate driver 520, and a controller (T_CON) 530.

The source driver 510, the gate driver 520, and the controller 530 may be coupled between the power supply pad VDD_P and the ground pad GND_P. Therefore, the source driver 510, the gate driver 520, and the controller 530 may operate using the supply voltage VDD received through the power supply pad VDD_P.

The controller 530 may receive the input data IDATA and the control signals CONS from the external host. For example, the control signals CONS may include a horizontal synchronization signal, a vertical synchronization signal, a main clock signal, etc.

The controller 530 may generate a gate control signal GCS and a source control signal SCS based on the horizontal synchronization signal, the vertical synchronization signal, and the main clock signal.

In addition, the controller 530 may divide the input data IDATA into units by frame based on the vertical synchronization signal and divide the input data IDATA into units by gate line based on the horizontal synchronization signal to generate image data RGB.

According to exemplary embodiments of the inventive concept, the image data RGB may include red image data corresponding to the red pixels, green image data corresponding to the green pixels, and blue image data corresponding to the blue pixels.

The controller 530 may provide the gate control signal GCS to the gate driver 520, and provide the source control signal SCS and the image data RGB to the source driver 510.

The gate driver 520 may be coupled to the plurality of gate lines GL1~GLn through the pads 210 of the display driver integrated circuit 200a and the external pads 12 formed on the film 11. The gate driver 520 may consecutively select the plurality of gate lines GL1~GLn based on the gate control signal GCS.

The source driver 510 may be coupled to the plurality of data lines DL1~DLm through the pads 210 of the display driver integrated circuit 200a and the external pads 12 formed on the film 11. The source driver 510 may generate a plurality of driving voltages by processing the image data RGB based on the source control signal SCS, and provide the plurality of driving voltages to the display panel 600 through the plurality of data lines DL1~DLm.

For example, the source driver 510 may generate a red driving voltage corresponding to the red image data, a green driving voltage corresponding to the green image data, and a blue driving voltage corresponding to the blue image data, and provide the red driving voltage, the green driving voltage, and the blue driving voltage to the red, green, and blue pixels, respectively, of the display panel 600, through the plurality of data lines DL1~DLm.

The first ESD protection circuit 100-1 may be coupled between the power supply pad VDD_P and the ground pad GND_P. The second ESD protection circuit 100-2 may be coupled between the power supply pad VDD_P and the data input/output pad IO_P. The third ESD protection circuit 100-3 may be coupled between the data input/output pad IO_P and the ground pad GND_P.

The first ESD protection circuit 100-1, the second ESD protection circuit 100-2, and the third ESD protection circuit 100-3 may be turned off while the display driver circuit 500 performs a normal operation.

When an ESD event occurs at the power supply pad VDD_P such that a plurality of charges flows into the display driver integrated circuit 200a through the power supply pad VDD_P, the first ESD protection circuit 100-1, the second ESD protection circuit 100-2, and the third ESD protection circuit 100-3 may be turned on. In this case, a part of the plurality of charges flowing into the display driver integrated circuit 200a through the power supply pad VDD_P may be safely discharged to the ground voltage GND through the first ESD protection circuit 100-1 and the ground pad GND_P. The rest of the plurality of charges may be safely discharged to the ground voltage GND through the second ESD protection circuit 100-2, the third ESD protection circuit 100-3, and the ground pad GND_P.

When an ESD event occurs at the data input/output pad IO_P such that a plurality of charges flows into the display driver integrated circuit 200a through the data input/output pad IO_P, the first ESD protection circuit 100-1, the second ESD protection circuit 100-2, and the third ESD protection circuit 100-3 may be turned on. In this case, a part of the plurality of charges flowing into the display driver integrated circuit 200a through the data input/output pad IO_P may be safely discharged to the ground voltage GND through the third ESD protection circuit 100-3 and the ground pad GND_P. The rest of the plurality of charges may be safely discharged to the ground voltage GND through the second ESD protection circuit 100-2, the first ESD protection circuit 100-1, and the ground pad GND_P.

As illustrated in FIG. 15, the dummy metal pattern 300 may be coupled to at least one of the power supply pad VDD_P, the data input/output pad IO_P, and the ground pad GND_P through the first wiring WR1 formed on the film 11. Therefore, the dummy metal pattern 300 may be electrically connected to the first ESD protection circuit 100-1, the second ESD protection circuit 100-2, and the third ESD protection circuit 100-3 through the first wiring WR1.

Therefore, when an ESD event occurs in the dummy metal pattern 300, a plurality of charges, flowing into the display driver integrated circuit 200a from the dummy metal pattern 300 through the first wiring WR1, may be safely discharged to the ground voltage GND through the first ESD protection circuit 100-1, the second ESD protection circuit 100-2, and the third ESD protection circuit 100-3.

Hereinabove, the source driver 510, the gate driver 520, and the controller 530, as described with reference to FIG. 15, are included in one film-type display driver integrated circuit package 20. However, exemplary embodiments are not limited thereto. According to exemplary embodiments of the inventive concept, at least one of the source driver 510, the gate driver 520, and the controller 530 may be included in a separate film-type display driver integrated circuit package, e.g., the source driver 510 and the gate driver 520 are included in a first film-type display driver integrated circuit package and the controller 530 is included in a second film-type display driver integrated circuit package.

Figure 16:
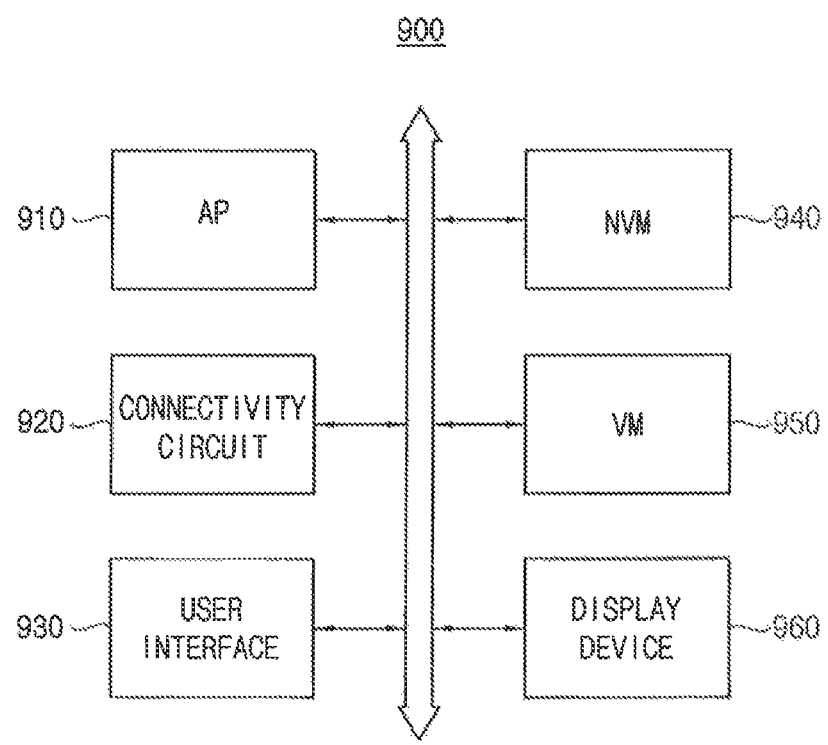
FIG. 16 is a block diagram illustrating a computing system according to an exemplary embodiment of the inventive concept.

FIG. 16 is a block diagram illustrating a computing system according to an exemplary embodiment of the inventive concept.

Referring to FIG. 16, a computing system 900 includes an application processor (AP) 910, a connectivity circuit 920, a user interface 930, a nonvolatile memory device (NVM) 940, a volatile memory device (VM) 950, and a display device 960. According to exemplary embodiments of the inventive concept, the computing system 900 may be a mobile phone, a smart phone, a personal digital assistant (PDA), a portable multimedia player (PMP), a digital camera, a music player, a portable game console, a navigation system, etc.

The nonvolatile memory device 940 may store a boot image for booting the computing system 900. In addition, the nonvolatile memory device 940 may store multimedia data. For example, the nonvolatile memory device 940 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The application processor 910 may execute applications, such as a web browser, a game application, a video player, etc. In addition, the application processor 910 may read the multimedia data from the nonvolatile memory device 940, generate input data corresponding to the multimedia data, and provide the input data to the display device 960. According to exemplary embodiments of the inventive concept, the application processor 910 may include a single core or multiple cores. For example, the application processor 910 may be a multi-core processor, such as a dual-core processor, a quad-core processor, a hexa-core processor, etc. The application processor 910 may include an internal or external cache memory.

The connectivity circuit 920 may perform wired or wireless communication with an external device. For example, the connectivity unit 920 may perform Ethernet communication, near field communication (NFC), radio frequency identification (RFID) communication, mobile telecommunication, memory card communication, universal serial bus (USB) communication, etc. According to exemplary embodiments of the inventive concept, the connectivity circuit 920 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 950 may store data processed by the application processor 910, or may operate as a working memory.

The user interface 930 may include at least one input device, such as a keypad, a touch screen, etc., and at least one output device, such as a speaker, a printer, etc.

The display device 960 may display the input data provided from the application processor 910. The display device 960 may be implemented with the display device 30 of FIG. 15. A structure and an operation of the display device 30 of FIG. 15 are described above with reference to FIGS. 1 to 15. Therefore, detailed description of the display device 960 will be omitted.

According to exemplary embodiments of the inventive concept, the computing system 900 may further include an image processor and/or a storage device, such as a memory card, a solid state drive (SSD), etc.

According to exemplary embodiments of the inventive concept, the computing system 900 and/or components of the computing system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

FIG. 17 is a block diagram illustrating an example of an interface used in the computing system of FIG. 16.

Referring to FIG. 17, a computing system 1000 may be implemented by a data processing device (e.g., a cellular phone, a personal digital assistant, a portable multimedia player, a smart phone, etc.) that uses or supports a mobile industry processor interface (MIPI) interface. The computing system 1000 may include an application processor 1110, an image sensor 1140, a display device 1150, etc.

A CSI host 1112 of the application processor 1110 may perform serial communication with a CSI device 1141 of the image sensor 1140 via a camera serial interface (CSI). According to exemplary embodiments of the inventive concept, the CSI host 1112 may include a deserializer (DES), and the CSI device 1141 may include a serializer (SER). A DSI host 1111 of the application processor 1110 may perform serial communication with a DSI device 1151 of the display device 1150 via a display serial interface (DSI). According to exemplary embodiments of the inventive concept, the DSI host 1111 may include a serializer (SER), and the DSI device 1151 may include a deserializer (DES).

The computing system 1000 may further include a radio frequency (RF) chip 1160 performing communications with the application processor 1110. A physical layer (PHY) 1113 of the application processor 1110 and a physical layer (PHY) 1161 of the RF chip 1160 may perform data communications based on a MIPI DigRF. The application processor 1110 may further include a DigRF MASTER 1114 that controls the data communications according to the MIPI DigRF of the PHY 1161, and the RF chip 1160 may further include a DigRF SLAVE 1162 controlled by the DigRF MASTER 1114.

The computing system 1000 may further include a global positioning system (GPS) 1120, a storage 1170, a MIC 1180, a DRAM device 1185, and a speaker 1190. In addition, the computing system 1000 may perform communications using an ultra wideband (UWB) 1210, a wireless local area network (WLAN) 1220, a worldwide interoperability for microwave access (WIMAX) 1230, etc. However, the structure and the interface of the computing system 1000 are not limited thereto.

While the inventive concept has been shown and described with reference to exemplary embodiments thereof, it will be apparent to those of ordinary skill in the art that various modifications in form and detail may be made thereto without materially departing from the spirit and scope of the present inventive concept as defined by the following claims.

What is claimed is:

1. A film-type semiconductor package, comprising:
   a semiconductor integrated circuit formed on a film, the semiconductor integrated circuit comprising a plurality of pads and an electrostatic discharge (ESD) protection circuit; and
   a dummy metal pattern formed on the film, wherein the dummy metal pattern is electrically connected to the ESD protection circuit through a first wiring formed on the film,
   wherein the ESD protection circuit is coupled between a first pad and a second pad among the plurality of pads, and the dummy metal pattern is electrically connected to at least one of the first pad and the second pad through the first wiring.

2. The film-type semiconductor package of claim 1, wherein the semiconductor integrated circuit communicates with an external device through a wiring pattern,
wherein the wiring pattern is formed on the film and is coupled to the plurality of pads.

3. The film-type semiconductor package of claim 1, wherein the first pad is a power supply pad to which a supply voltage is provided, and the second pad is a ground pad to which a ground voltage is provided.

4. The film-type semiconductor package of claim 1, wherein the first pad is a data input/output pad through which data is transmitted, and the second pad is a ground pad to which a ground voltage is provided.

5. The film-type semiconductor package of claim 1, wherein the first pad is a power supply pad to which a supply voltage is provided and the second pad is a ground pad to which a ground voltage is provided,
wherein the semiconductor integrated circuit further comprises:
a display driver circuit coupled between the power supply pad and the ground pad, the display driver circuit operating using the supply voltage.

6. The film-type semiconductor package of claim 5, wherein the dummy metal pattern is coupled to the power supply pad through the first wiring.

7. The film-type semiconductor package of claim 1, wherein the first pad is a data input/output pad and the second pad is a ground pad to which a ground voltage is provided,
the semiconductor integrated circuit further comprises:
a power supply pad, among the plurality of pads, to which a supply voltage is provided; and
a display driver circuit coupled to the power supply pad, the ground pad, and the data input/output pad, the display driver circuit transmitting data through the data input/output pad using the supply voltage.

8. The film-type semiconductor package of claim 7, wherein the dummy metal pattern is coupled to the data input/output pad through the first wiring.

9. The film-type semiconductor package of claim 1, wherein the semiconductor integrated circuit further comprises:
a power supply pad, among the plurality of pads, to which a supply voltage is provided;
a ground pad, among the plurality of pads, to which a ground voltage is provided;
a data input/output pad among the plurality of pads; and
a display driver circuit coupled to the power supply pad, the ground pad, and the data input/output pad, the display driver circuit transmitting data through the data input/output pad using the supply voltage,
wherein the first pad is one of the power supply pad and the data input/output pad,
the second pad is the ground pad, and
the ESD protection circuit comprises:
a first ESD protection circuit coupled between the power supply pad and the ground pad;
a second ESD protection circuit coupled between the power supply pad and the data input/output pad; and
a third ESD protection circuit coupled between the data input/output pad and the ground pad.

10. The film-type semiconductor package of claim 9, wherein the dummy metal pattern is coupled to the power supply pad through the first wiring.

11. The film-type semiconductor package of claim 9, wherein the dummy metal pattern is coupled to the data input/output pad through the first wiring.

12. The film-type semiconductor package of claim 9, wherein the dummy metal pattern is coupled to the ground pad through the first wiring.

13. The film-type semiconductor package of claim 1, wherein the semiconductor integrated circuit is a display driver integrated circuit.

14. A film-type display driver integrated circuit package, comprising:
a display driver integrated circuit formed on a film, the display driver integrated circuit comprising a first pad, a second pad, a display driver circuit coupled between the first pad and the second pad, and an electrostatic discharge (ESD) protection circuit coupled between the first pad and the second pad; and
a dummy metal pattern formed on the film, wherein the dummy metal pattern is electrically connected to at least one of the first pad and the second pad through a first wiring formed on the film.

15. A film-type semiconductor package, comprising:
a semiconductor integrated circuit formed on a film, the semiconductor integrated circuit comprising a first electrostatic discharge (ESD) protection circuit, a first pad, and a second pad;
a dummy metal pattern formed on the film, wherein the dummy metal pattern is electrically connected to the first ESD protection circuit through a first wiring formed on the film,
wherein the first ESD protection circuit comprises:
a semiconductor substrate;
an n-type well formed in the semiconductor substrate;
a p-type well formed in the semiconductor substrate, wherein the p-type well contacts the n-type well;
a first impurity region formed in the n-type well;
a second impurity region formed in the n-type well;
a third impurity region formed in the p-type well;
a fourth impurity region formed in the p-type well;
a fifth impurity region formed in the p-type well;
a sixth impurity region formed at a boundary region between the n-type well and the p-type well; and
a gate,
wherein the first impurity region and the fourth impurity region are n-type,
the second impurity region, the third impurity region, the fifth impurity region, and the sixth impurity region are p-type,
the first impurity region, the second impurity region, and the gate are connected to the first pad, and
the third impurity region and the fourth impurity region are connected to the second pad.

16. The film-type semiconductor package of claim 15, wherein an impurity concentration of the sixth impurity region is higher than an impurity concentration of the p-type well.

17. The film-type semiconductor package of claim 15, wherein the gate is formed above the semiconductor substrate and between the second impurity region and the sixth impurity region, wherein the second impurity region, the sixth impurity region, and the gate form a metal oxide semiconductor transistor.

18. The film-type semiconductor package of claim 15, wherein a first distance between the n-type well and the fifth impurity region is smaller than a second distance between the n-type well and the third impurity region.

19. The film-type semiconductor package of claim 15, wherein the semiconductor integrated circuit further comprises a second ESD protection circuit and the second ESD protection circuit is a Zener diode.

* * * * *